United States Patent [19]

Sittig

[11] Patent Number: 4,736,232
[45] Date of Patent: Apr. 5, 1988

[54] THYRISTOR WITH INTEGRATED POWER SUPPLY FOR AN ASSOCIATED CIRCUIT AND METHOD FOR MANUFACTURE THEREOF

[75] Inventor: Roland Sittig, Munich, Fed. Rep. of Germany

[73] Assignee: Siemens Aktiengesellshaft, Berlin and Munich, Fed. Rep. of Germany

[21] Appl. No.: 5,784

[22] Filed: Jan. 22, 1987

[30] Foreign Application Priority Data

Jan. 24, 1986 [DE] Fed. Rep. of Germany ....... 3602149

[51] Int. Cl.4 ............................................. H01L 29/06
[52] U.S. Cl. ........................................ 357/20; 357/22; 357/30; 357/38; 357/55; 357/86
[58] Field of Search ................... 357/20, 38, 86, 30, 357/55, 22

[56] References Cited

U.S. PATENT DOCUMENTS

| 3,979,767 | 9/1976 | Nakata et al. | 357/38 |
| 4,546,401 | 10/1985 | Svedberg | 357/38 |
| 4,587,546 | 5/1986 | Herberg | |
| 4,609,835 | 9/1986 | Sakai et al. | 357/20 |

FOREIGN PATENT DOCUMENTS 3226613 1/1984 Fed. Rep. of Germany.

Primary Examiner—Joseph E. Clawson, Jr.
Attorney, Agent, or Firm—Hill, Van Santen, Steadman & Simpson

[57] ABSTRACT

A thyristor having a p-n-p-n semiconductor construction has a shoulder of the n-base extending through the p-base to an exterior surface of the body of the thyristor and is connected to an associated circuit to supply the circuit with operating current. The shoulder has a first part at the boundary surface of the body and a second part with smaller cross-sectional dimensions, connected between the first part and the n-base. The cross-sectional dimensions of the conductive connection between the shoulder and the external circuit are less than the corresponding dimensions of the first part, such that the conductive coating is shielded from the space charge zone adjacent the second part.

7 Claims, 3 Drawing Sheets

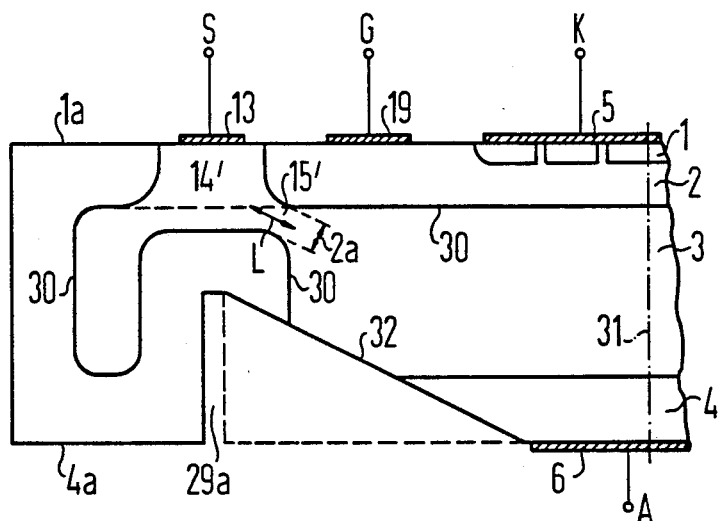
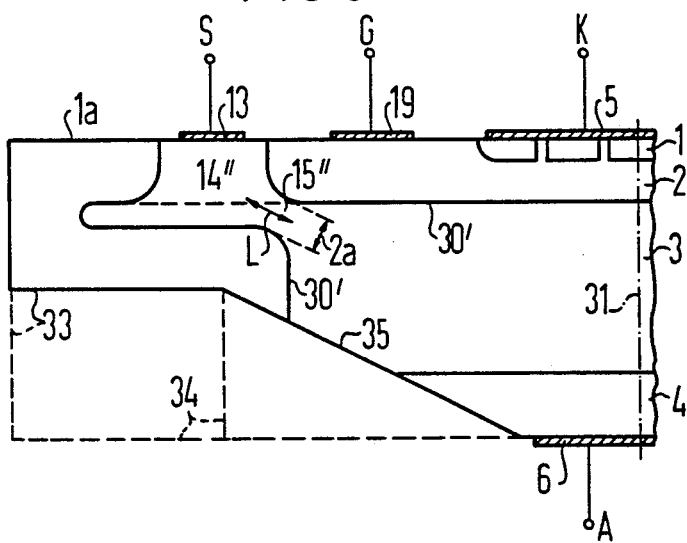

THYRISTOR WITH INTEGRATED POWER SUPPLY FOR AN ASSOCIATED CIRCUIT AND METHOD FOR MANUFACTURE THEREOF

BACKGROUND

The present invention relates to a thyristor used with an associated circuit supplied with operating current from the thyristor, and more particularly to such a thyristor which has a shoulder of its n-base projecting through its p-base to the cathode side with a connection from the shoulder to an external circuit.

A thyristor of this general type is disclosed in German patent publication No. A-32 26 613. The associated circuit comprises a light-sensitive switch element connected between the conductive coating and the cathode of the thyristor. The switch element, such as for example a phototransistor, exhibits a relatively low blocking capability and a high photosensitivity, so that the overall system including the thyristor and the switch element comprises both a great trigger sensitivity as well as a great blocking capability. A disadvantage of this arrangement, however, is that the conductive coating, with a high blocking voltage, is close to the region of the space charge zone at the p-n junction between the two base layers, which space charge zone largely fills out the shoulder of the n-base. This leads to leakage currents which can bring about an unintentional ignition of the thyristor under some conditions, or which can make a desired ignition more difficult under other conditions.

BRIEF DESCRIPTION OF THE INVENTION

A principal object of the present invention is to provide a thyristor of the type described wherein such leakage currents are largely avoided and a reliable and controllable power supply is provided for the associated circuit. This is achieved in the present invention by arranging the shoulder of the n-base to have a first part located at the boundary surface which is larger in both dimensions parallel to the boundary surface than the conductive coating by which the shoulder is connected to an external circuit, and a second part connecting the first part through the p-base to the main part of the n-base, with the cross-sectional dimensions of the second part being less than the corresponding dimensions of the first part, to isolate the conductive coating from the space charge zone between the shoulder and the p-base.

The present invention obtains the advantage that the associated circuit is supplied with the required electrical power in a controllable way, so that both the maximum operating voltage and maximum operating current supplied thereto are prescribed by an appropriate dimensioning of the second part of the shoulder.

These and other advantages of the present invention will become manifest by inspection of the following description and accompanying drawings.

BRIEF DESCRIPTION OF THE DRAWINGS

Reference will now be made to the accompanying drawings in which:

FIG. 4 is a cross-section of a further embodiment of the present invention illustrating a method of making the thyristors of FIGS. 1 and 3; and FIG. 5 is a cross-section of a further embodiment of the invention illustrating another method of making the thyristors of FIGS. 1 and 3.

DESCRIPTION OF THE PRESENTLY PREFERRED EMBODIMENTS

Figure 1:
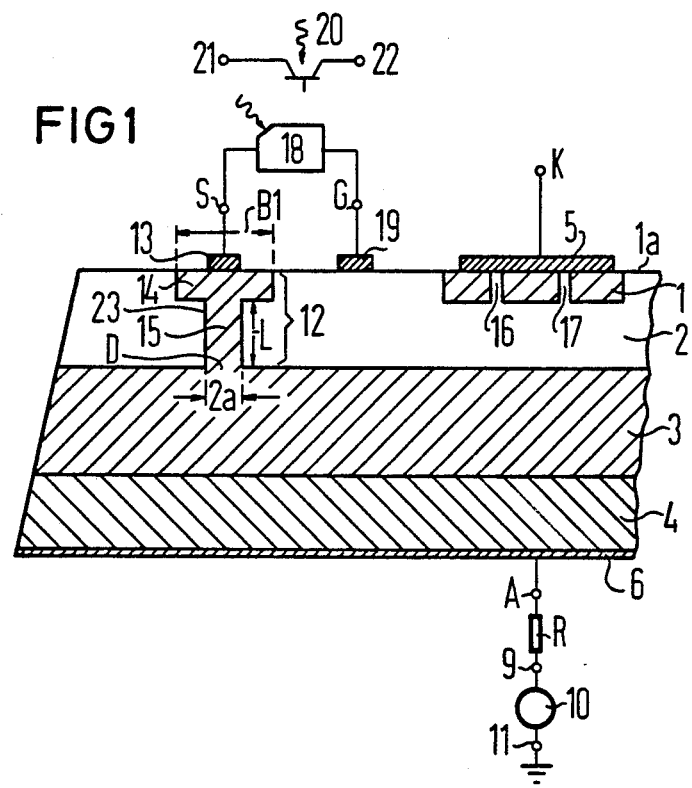
FIG. 1 is a cross-sectional view of a first exemplary embodiment of the invention with an associated circuit for light triggering of the thyristor.

FIG. 1 shows a thyristor comprising a semiconductor body of doped semiconductor material, for example silicon, which comprises four successive layers of alternating conductivity types. These are the n-emitter 1, the p-base 2, the n-base 3 and the p-emitter 4. The n-emitter 1 is provided with an electrode 5 at the cathode side and the p-emitter 4 is provided with an electrode 6 at the anode side. The electrodes are composed of an electrically conductive material, for example aluminum. The electrode 5 is connected to ground via a terminal K; the electrode 6 is connected to the upper terminal 9 of a voltage source 10 via a terminal A and a load resistor R, the lower terminal 11 of said voltage source 10 being connected to at ground.

The n-base has a n-conductive shoulder 12 which penetrates the p-base 2, extends up to the boundary surface 1a of the semiconductor body, and is contacted there by a conductive coating 13. The shoulder 12 is composed of a first part 14 and of a second part 15 which is arranged between the part 14 and the n-base 3. The cross-section of the part 15 can, for example, have a quadratic or rectangular shape, and the visible dimension B1 is dimensioned greater than the corresponding dimension of the coating 13. The width of the part 14 measured perpendicular to the plane of the drawing, is likewise dimensioned greater than the dimension of the coating 13 in this direction. Further, the cross-sectional dimensions of the second part 15 likewise comprise a quadratic or rectangular cross section, i.e. the depth $2a$ measured in the plane of the drawing, and the width Z measured perpendicular thereto, are dimensioned smaller than the corresponding dimensions of the part 14. The length of the part 15 is referenced L in the drawings.

The n-emitter 1 is provided with emitter-base short circuit paths which are composed of shoulders 16 and 17 of the p-base 2 which penetrate the n-emitter 1 and are contacted by the electrode 5 at the boundary surface 1a. The coating 13 has a terminal S which is connected to the first terminal of a circuit unit 18 associated with the thyristor. This contains a light-sensitive switch element which is preferably followed by an amplifier stage. The simplest case, the unit 18, as indicated in FIG. 1, is composed of a phototransistor 20 whose terminals 21 and 22 are respectively connected to S and G, so that the terminals S and G are connected to one another via the switching path of the phototransistor 20.

The second part 15 of the shoulder 12 can be interpreted as the channel of an intrinisc layer field effect transistor (JFET) comprising a channel depth $2a$, a channel length L and a channel width Z whose source terminal is formed by S and whose drain is formed by the n-base 3. The p-base surrounding the channel 15 represents a gate region that is contacted by 19 and is controllable via the terminal G. Via the short circuit paths 16 and 17, G always lies at the ground potential of the electrode 5 at the cathode side.

Figure 2:
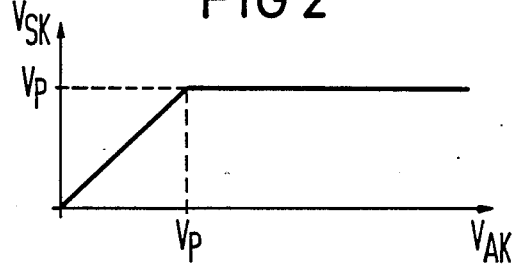
FIG. 2 is a voltage diagram serving to explain operation of the apparatus of FIG. 1.

When it is assumed that the light-sensitive switch element of the circuit unit 18 is not illuminated, then the connection between S and G is extremely high in resistance. When the anode voltage $V_{AK}$ is then allowed to rise from zero in the direction toward positive values, then the potential at the terminal S and at a point D, which roughly identifies the junction between the channel 15 and the n-base 3, corresponds initially to the voltage $V_{AK}$. When $V_{AK}$ reaches a value $V_P$ at which the full cross-section of the channel 15 is filled out by the space charge zone, which builds up at the p-n junction 23 between the shoulder 12 and the p-base 2, then the circuit points S and D also lie at $V_P$. A further rise $V_{AK}$, for example to 5000 volts and above, then no longer influences the voltage at S and D. When the voltage $V_{SK}$ between the terminals S and K is entered over the anode voltage $V_{AK}$, then this condition can be illustrated in accord with FIG. 2, where the abcissa is $V_{AK}$ and the ordinate is $V_{SK}$, reaching the limit value $V_P$.

As may be derived from the book by S. M. Sze, "Physics of Semiconductor Devices", Wiley & Sons, New York, 1969, cf. pp. 340–351, the value of $V_P$ can be determined by a corresponding selection of the doping concentration $N_D$ of the shoulder 12, and of half the channel depth a, in accord with the relationship:

$$V_p = \frac{Q \cdot N_D \cdot a^2}{2 \cdot \epsilon_s} \tag{1}$$

where $\alpha$ represents the elementary charge, and $\epsilon_s$ represents the dielectric constant of the semiconductor material. With $N_D = 2.10^{13}$ cm$^{-3}$ and $a = 5.10^{-3}$ cm, a value of about 40 volts is determined for $V_P$.

When, given an anode voltage $V_{AK}$ exceeding $V_P$, the terminals S and G are connected to one another in low resistance fashion, then the drain voltage $V_D = V_P$ for the JFET, and its gate voltage $V_G = 0$ (respectively referred to S). The maximum drain current $I_{DSat}$ is calculated by the relationship:

$$I_{DSat} = I_p \left[ 1 - 3 \frac{V_{bi}}{V_P} + 2 \left( \frac{V_{bi}}{V_P} \right)^{3/2} \right] = 0.95 \, I_p \tag{2}$$

$I_P$ is defined by the relationship $$I_p = \frac{2Z\mu Q^2 N_D^2 a^3}{6\epsilon_s L} \tag{3}$$

where $V_{bi}$ denotes the impressed voltage at the p-n junction between the parts 2 and 15, and $\mu$ denotes the charge carrier mobility in the channel 15. $I_P$ can be set independently by means of the channel Z of the part 15. With the above values and $Z = 0.3$ cm as well as $L = 5.10^{-13}$ cm, for example, a value of about 25 mA results for $I_P$.

In the structure of FIG. 1, the shoulder 12 has the significance of an integrated power supply part which can supply the circuit unit 18 with a maximum operating current $I_{DSat}$ when $V_{AK}$ rises above $V_P$. When the light-sensitive switch element in 18 is illuminated, then, given the structure design set forth above, a drain current flows, up to 25 mA, dependent on the light intensity and the gain of the circuit unit 18. This is supplied to the terminal G of the trigger electrode 19 as trigger current. The light energy which is supplied to the circuit unit 18 for triggering the ignition is significantly lower than that which would have to be supplied to the thyristor for direct light ignition.

The cross-sectional dimensions of the first part 14 of the shoulder 12 are selected to be greater than the dimensions of the coating 13, because this guarantees that the coating 13 does not come into contact with the space charge zone forming at the p-n junction 23. Disturbing leakage currents are avoided in this way.

Figure 3:
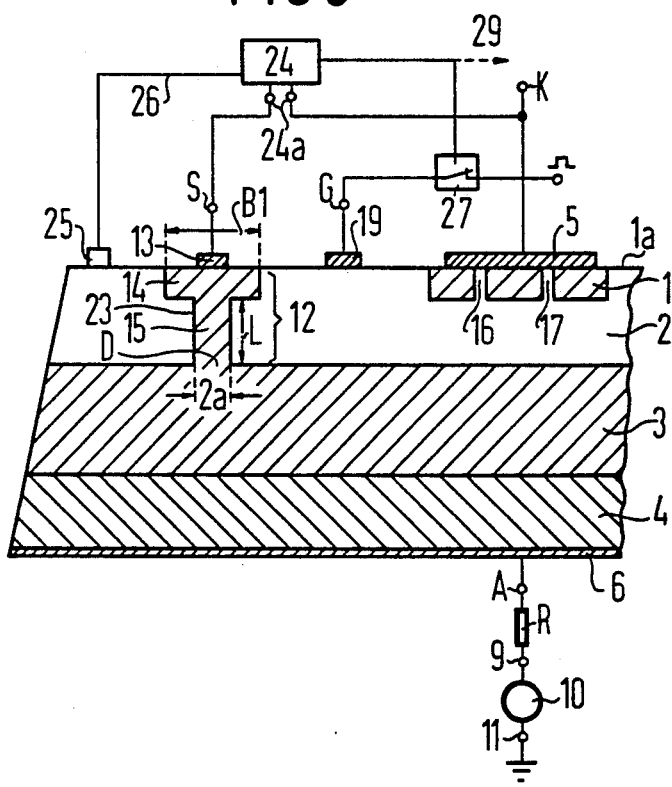
FIG. 3 is a cross-sectional diagram of a second exemplary embodiment of the invention using a logic circuit for processing the signals of a temperature sensor as the associated circuit unit.

FIG. 3 shows another exemplary embodiment of the invention which completely corresponds to the semiconductor structure of FIG. 1 but which differs by the use of a different wiring of S, G and K. A circuit unit 24 associated with the thyristor is provided which is supplied with operating current from the load circuit connected at A and K, being supplied therewith via the integrated power supply part 12. A logic circuit 24 is connected via a line 26 to a temperature sensor 25 located at the boundary surface 1a. The temperature sensor 25 supplies a signal when the semiconductor body of the thyristor reaches a maximum allowable temperature, or has exceeded it. This signal is processed into a switch signal by the circuit 24, and this switch signal opens an electronic switch 27 so that an ignition current pulse 28 which is supplied by an ignition current circuit (not shown) cannot reach the terminal G. Ignition of the thyristor is thus suppressed until its temperature has again dropped below the maximum allowable value. The logic circuit 24 can also be fashioned as an alarm logic which, when the critical temperature is reached, communicates an alarm related thereto to a monitoring location, as indicated by the arrow 29. The operating current for the logic circuit 24 is supplied via the terminals 24a connected to S and K.

The manufacture of the thyristor structure of FIGS. 1 and 3 is carried out in a traditional way by means of a series of diffusion steps which are executed upon application of diffusion masks. FIG. 4 shows a modification of this thyristor structure which can be manufactured in a simpler way. The basis is thereby formed by a wafer of n-doped semiconductor material, for example silicon. Before the execution of a deep p-diffusion forming the p-base 2 and the p-emitter 4, the boundary surface 1a, in the region of the coating 13, is covered by a diffusion mask and a deep notch 29a proceeding from the boundary surface 4a is applied at the other side of the wafer. After the p-diffusion, the semiconductor wafer comprises p-regions at the edge which are limited by the lines 30 from the inner wafer part. An in-diffusion of the n-emitter 1 into the p-base 2 subsequently is performed. When the part of the wafer shown with broken lines is removed, up to the line 32, by beveling the p-n junction at the anode side, then a structure is produced which fundamentally corresponds to the thyristor structure of FIG. 1. In detail, the part 14' corresponds to the first part 14 of the shoulder 12 of FIG. 1, whereas the channel 15 of FIG. 1 is replaced by the part 15', whose length and depth are again referenced L and 2a. After the application of the coatings 13, 19, 5 and 6, the terminals S, G, K and A can be wired in accord with FIG. 1 or FIG. 3.

Given a cylindrical-symmetrically formation of the thyristor having an axis of symmetry 31, the notch 29a can also have a cylindrical shape. When, by contrast, the notch proceeds on a straight line from wafer edge to wafer edge, then the part of the wafer edge lying to the right thereof must be beveled to such degree that the lateral limiting surface proceeds through the n-doped wafer region which lies outside the part 14' in radial direction of the wafer.

FIG. 5 shows a thyristor which is also manufactured in the way set forth above but with the departure that, instead of a notch 29a, a part of the semiconductor wafer bounded by the lines 33 and 34 is now removed. Upon execution of the p-diffusion, p-regions at the edge side are produced, which are limited from the interior of the wafer by the lines 30'. When that part of the semiconductor wafer indicated with broken lines is then removed to the line 35, by beveling the p-n junction at the anode side, then a structure comparable to FIG. 1 again arises, whereby the parts 14" and 15"—the latter comprising the length L and the depth 2a—correspond to the parts 14 and 15. The terminals S, G, K and A can again be wired in accord with FIG. 1 or FIG. 3. Given a cylindrical-symmetrical fashioning of the thyristor, an annular part of the wafer whose cross section is limited by 33, 34 can also be removed. The line 35 then denotes a part of a conical surface. When, however, a wafer part which is limited by two planar surface parts lying perpendicular to the plane of the drawing is removed, these surface parts corresponding to the horizontal line 33 and the vertical line 34, then that part of the wafer edge lying to the right of the vertical line 34 must again be beveled such that the lateral limiting surface proceeds through the n-doped wafer region which lies outside of the part 14" in the radial direction of the wafer.

The scope of the invention embraces further embodiments wherein a plurality of shoulders 12 are arranged next to one another and are provided with allocated coatings 13. As a result thereof a larger maximum operating current may be supplied to the circuit unit 18 or 24. A respective n-doped auxiliary emitter (amplifying gate) fashioned in a traditional way can be provided between the coating 19 and the n-emitter 1, this auxiliary emitter being provided with a conductive coating on the surface 1a, which coating projects beyond the p-n junction in the direction toward the n-emitter 1.

The circuit units 18 and 24 set forth can be replaced by any other arbitrary circuit units associated with the thyristor, which circuits are then supplied with operating electrical power acquired via the shoulder 12 from the load circuit of the thyristor. These include, for example, logic circuits which process the signals of sensors responding to excess anode voltages, excess rates of voltage rise or excess load currents.

What is claimed is:

1. A thyristor having a semiconductor body with an n-emitter, a cathode electrode in contact with said n-emitter, a p-base, an n-base adjacent said p-base, and a p-emitter adjacent said n-base, and an anode electrode in contact with said p-emitter, said n-base having a shoulder penetrating through said p-base up to a boundary surface at the cathode side of said p-base, a conductive coating on said shoulder at said boundary surface, a circuit unit connected to said conductive coating for receiving an operating current from said shoulder, said shoulder comprising a first part at said boundary surface and carrying said conductive coating and a second part interconnected between said first part and said n-base, the cross-sectional dimensions of said first part being greater than the corresponding dimensions of said conductive coating and greater than the corresponding dimensions of said second part, whereby said conductive coating is isolated from the space charge zone in the area of said first and second parts.

2. Apparatus according to claim 1, wherein said circuit unit comprises a photosensitive element unit and an amplifier having its input connected to the output of said photosensitive element, and connecting means for connecting said circuit unit between said conductive coating and a terminal connected to said p-base.

3. Apparatus according to claim 2, wherein said light-sensitive circuit comprises a phototransistor.

4. Apparatus according to claim 1, wherein said circuit unit comprises a logic circuit and a sensor unit electrically connected to said logic circuit for monitoring the operating behavior of said thyristor, and connecting means for connecting one terminal of said logic circuit to said conductive coating and for connecting another terminal of said logic circuit to said cathode electrode, whereby an operating current is supplied to said logic circuit.

5. Apparatus according to claim 4, wherein said sensor unit is juxaposed with said thyristor for monitoring the temperature of said thyristor, and including a switch connected to an output of said logic circuit and responsive thereto for disabling triggering of said thyristor.

6. Apparatus according to any one of claims 1–5, wherein the body of said thyristor is made up of n-doped semiconductor material, said p-base and p-emitter are formed in said semiconductor material by deep diffusion, employing a doping mask covering the region above said shoulder, said body having a deep notch on the boundary surface of said anode side opposite said shoulder, and the p-n junction at the anode side being beveled such that the p-doped semiconductor region at the lateral faces of said notch does not constitute a conductive connection to said p-emitter.

7. Apparatus according to any one of claim 1–5, wherein said body is formed of n-doped semiconductor material, said p-doped regions being formed by a deep diffusion employing a doping mask covering the region over said shoulder at the boundary surface on said cathode side, a portion of said semiconductor body being removed at a location lying opposite said shoulder, said p-base and p-emitter being formed by deep p-diffusion, and the p-n junction at the anode side being beveled, such that the p-doped semiconductor region adjacent the recess caused by removal of said removed portion does not constitute a conductive connection to said p-emitter.

* * * * *